United States Patent
Blaum et al.

(10) Patent No.: US 9,252,815 B2
(45) Date of Patent: Feb. 2, 2016

(54) EXTENSION OF PRODUCT CODES WITH APPLICATIONS TO TAPE AND PARALLEL CHANNELS

(71) Applicant: International Business Machines Corporation, Armonk, NY (US)

(72) Inventors: Mario Blaum, San Jose, CA (US); Roy D. Cideciyan, Rueschlikon (CH); Steven R. Hetzler, Los Altos, CA (US); Thomas Mittelholzer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 14/107,104

(22) Filed: Dec. 16, 2013

(65) Prior Publication Data
US 2015/0169397 A1 Jun. 18, 2015

(51) Int. Cl.
| | |
|---|---|
| *H03M 13/00* | (2006.01) |
| *H03M 13/29* | (2006.01) |
| *H03M 13/15* | (2006.01) |
| *G06F 11/10* | (2006.01) |
| *H03M 13/37* | (2006.01) |

(52) U.S. Cl.
CPC ........... *H03M 13/29* (2013.01); *G06F 11/1012* (2013.01); *H03M 13/1515* (2013.01); *H03M 13/2909* (2013.01); *H03M 13/373* (2013.01)

(58) Field of Classification Search
CPC ............ H03M 13/29; H03M 13/2909; H03M 13/1515; H03M 13/373
See application file for complete search history.

(56) References Cited

U.S. PATENT DOCUMENTS

| | | | |
|---|---|---|---|
| 4,719,628 A | 1/1988 | Ozaki et al. | |
| 5,719,884 A | 2/1998 | Roth et al. | |
| 6,158,038 A * | 12/2000 | Yamawaki et al. | ........... 714/755 |
| 6,718,510 B2 * | 4/2004 | Kojima | ......................... 714/784 |
| 7,093,179 B2 | 8/2006 | Shea | |
| 7,873,894 B2 | 1/2011 | Eleftheriou et al. | |

(Continued)

OTHER PUBLICATIONS

Han, Yang et al., "Dual-mode decoding of product codes with application to tape storage," Global Telecommunications Conference, 2005. GLOBECOM'05, IEEE. vol. 3. IEEE, 2005, pp. 1255-1260.

(Continued)

*Primary Examiner* — Shelly A Chase
(74) *Attorney, Agent, or Firm* — Cantor Colburn LLP; Bryan Butler

(57) ABSTRACT

An aspect is a method that includes receiving $(k_0-1)k_1+k_2$ write data symbols, where $k_2 < k_1$. The write data symbols are arranged in an array that includes $k_0-1$ rows of length $k_1$ followed by a row of length $k_2$. The first $k_2$ columns are encoded to form a partially encoded array using a vertical error correcting code of length m, $m > k_0$, resulting in $k_2$ columns of length m including the write data symbols and vertical parity values. The $k_0-1$ rows of the write data symbols of length $k_1$ and the $m-k_0+1$ rows from the partially encoded array are encoded into an encoded array of m rows of length n columns, $n > k_1$ including at least one parity value in each of the m rows, thereby enabling correction of up to $(n-k_1)/2$ errors in any row and up to $(n-k_2)/2$ errors in up to $m-k_0+1$ rows of the encoded array.

20 Claims, 8 Drawing Sheets

(56) References Cited

U.S. PATENT DOCUMENTS

| | | |
|---|---|---|
| 8,144,414 B2 | 3/2012 | Cherubini et al. |
| 8,276,045 B2 | 9/2012 | Cideciyan et al. |
| 2002/0083391 A1 | 6/2002 | Huggett et al. |
| 2012/0060071 A1 | 3/2012 | Shin et al. |

OTHER PUBLICATIONS

Mittelholzer, Thomas, and Evangelos Eleftheriou, "Reverse Concatenation of Product and Modulation Codes," Communications, 2008. ICC'08. IEEE International Conference on. IEEE, 2008, 5 pages.

* cited by examiner

EXTENSION OF PRODUCT CODES WITH APPLICATIONS TO TAPE AND PARALLEL CHANNELS

BACKGROUND

The present disclosure relates generally to error correcting codes and more specifically, to a combination of product codes and integrated interleaved codes with applications to tape and parallel channels.

Reliable delivery of data is essential in computer systems. To this end, such computer systems utilize error detection and correction schemes to detect errors in data delivery and reconstruct such data when an error is detected. This is especially important when such delivery of data is provided over unreliable communication channels or channels that are subject to interruptions, such as those exposed to channel noise. Data redundancy schemes such as parity computation enable reliable delivery of digital data using error correction and detection techniques. Most error detection and correction schemes utilize redundancy or add extra data to a message, which receivers can then use to check consistency of the delivered message. This also allows for recovery of data determined to be corrupted.

Systems like tape or, more generally systems involving transmission of data across simultaneous parallel channels, often rely on product codes to achieve this goal of reliable transmission of data. A product code is a technique to form a long length code with higher error-correcting code capabilities using smaller length constituent codes.

Whether used in data delivery or to guard against loss of data, error detecting and correcting codes use parity bits for establishing redundancy. Extensions and variations on the parity bit mechanisms for more sophisticated and larger data arrays are provided through horizontal and vertical redundancy checks or code. A horizontal redundancy check is applied independently to each of a parallel group of bit streams. The data must be divided into transmission blocks to which the additional check data are added. By contrast, a vertical redundancy check is used for synchronized parallel bits and is applied once per bit time, across the bit streams, necessitating one or more additional parallel channels for the check bit or bits.

The codewords of the disclosed coding scheme can be viewed as 2-dimensional arrays. In applications to tape and parallel channels, rows of these 2-dimensional arrays are mapped onto different tracks and channels, which exhibit large variations in error rate. Therefore, there is a need for array codes that have the capability of correcting different number of errors in the rows.

SUMMARY

An aspect is a method that includes receiving $(k_0-1)k_1+k_2$ write data symbols, where $k_2<k_1$. The write data symbols are arranged in an array that includes $k_0-1$ rows of length $k_1$ followed by a row of length $k_2$. The first $k_2$ columns of the write data symbols in the array are encoded to form a partially encoded array using a vertical error correcting code of length m, $m>k_0$, resulting in $k_2$ columns of length m including the write data symbols from the first $k_2$ columns and vertical parity values. The $k_0-1$ rows of the write data symbols of length $k_1$ and the $m-k_0+1$ rows of the write data symbols and the vertical parity values of length $k_2$ from the partially encoded array are encoded into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array.

Another aspect is a system that includes a storage array with a plurality of storage devices and an array controller. The array controller is configured to receive $(k_0-1)k_1+k_2$ write data symbols, where $k_2<k_1$, and arrange the write data symbols in an array including $k_0-1$ rows of length $k_1$ followed by a row of length $k_2$. The first $k_2$ columns of write data symbols in the array are encoded to form a partially encoded array using a vertical error correcting code of length m, $m>k_0$, resulting in $k_2$ columns of length m including the write data symbols from the first $k_2$ columns and vertical parity values. The $k_0-1$ rows of the write data symbols of length $k_1$ and the $m-k_0+1$ rows of the write data symbols and the vertical parity of length $k_2$ from the partially encoded array are encoded into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array. The encoded array is written across the storage devices in the storage array.

A further aspect is a computer program product that includes a computer readable storage medium having computer readable program code embodied therewith. The computer readable program code is executable by an array controller to receive $(k_0-1)k_1+k_2$ write data symbols, where $k_2<k_1$. The write data symbols are arranged in an array including $k_0-1$ rows of length $k_1$ followed by a row of length $k_2$. The first $k_2$ columns of write data symbols in the array are encoded to form a partially encoded array using a vertical error correcting code of length m, $m>k_0$, resulting in $k_2$ columns of length m including the write data symbols from the first $k_2$ columns and vertical parity values. The $k_0-1$ rows of the write data symbols of length $k_1$ and the $m-k_0+1$ rows of the write data symbols and the vertical parity of length $k_2$ from the partially encoded array are encoded into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the disclosure are apparent from the following detailed description taken in conjunction with the accompanying drawings in which:

FIG. 2 depicts an array populated by data in accordance with an embodiment;

FIG. 4 depicts the array of the embodiment of FIG. 3 as an encoded array after an Integrated Interleaved or Generalized Concatenation parity scheme has been applied to it in accordance with an embodiment;

DETAILED DESCRIPTION

Figure 1:
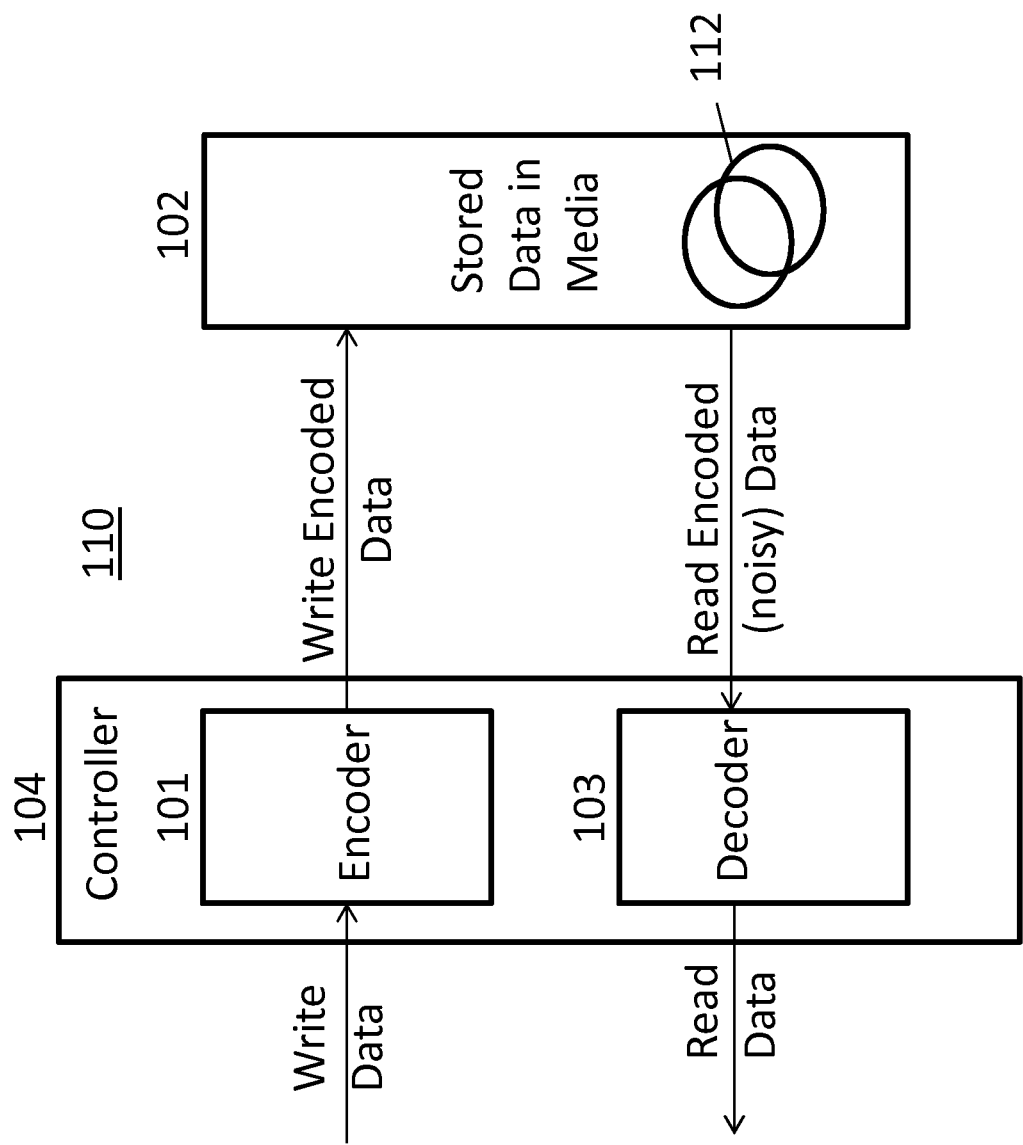
FIG. 1 illustrates a storage system in accordance with an embodiment.

FIG. 1 illustrates a storage system 110 in accordance with an embodiment. The storage system 110 may include numerous other elements such as receivers, transmitters, and clocks as known by those of ordinary skill in the art, which are not illustrated for purposes of clarity. As shown in FIG. 1, an array controller 104 includes an encoder 101 and a decoder 103 which may be implemented using one or more processing circuits, e.g., computer processors, and memory coupled thereto. The encoder 101 is utilized during a write process for receiving write data (e.g., from a host computer) and generating encoded write data, which includes both data and parity. In an embodiment, a write stripe is written to storage devices 112 in a storage array 102, which may include at least one tape involving a plurality of tracks in the storage array 102. The decoder 103 is utilized during a read process for reading tracks from the storage array 102, the tracks containing possibly noisy or corrupted encoded data. Based on this noisy encoded data, the decoder 103 may attempt to reconstruct the original write data using the methods as described below.

Error detection and correction codes have limitations in the number of bits that they can detect and correct in a data stream. In many instances, there is a cost associated with selecting schemes that allow for more bit detection and correction abilities. Therefore, in these instances, there is a trade-off between selecting cost and the detection and correction ability. An embodiment combines a horizontal error correction scheme with a vertical error correction scheme to provide improved results in terms of redundancy with respect to a straightforward product code for a similar capability in the correction of errors.

In one embodiment, one known type of data encoding scheme that is based on a product code (PC) encoding is used. The PC can be a two-dimensional encoding with N encoded data and parity symbols (where the symbols can be bits, bytes, or any fixed number of bits) that are arranged in a rectangular matrix with m rows and n columns, where N=mn. Each of the m rows in the matrix represents an n-element vector (data and parity) in one dimension and each of the n columns represents an m-element vector (also data and parity) in the other dimension.

In the present discussion, there are times when the location of a symbol in error is known. A symbol is the minimal unit used by an error-correcting code; it can be a bit, a byte, or a symbol containing any number of bits. For example, the well known Reed-Solomon (RS) codes use symbols containing a plurality of bits, like bytes. As used herein, the term "erasure correction" refers to instances relating to correcting an error whose location is known. An erasure correction is different from an "error correction" which, as used herein, refers to correcting an error whose location is not known. Correcting erasures requires about half of the amount of redundancy that is required to correct errors, when, for instance, RS codes are used.

As stated, an embodiment is provided with a hybrid error correction and detection scheme that combines vertical and horizontal encoding to achieve optimal latency, cost and error detection and correction abilities. Such an embodiment is discussed in connection with examples provided in FIGS. 2 through 4. In theses embodiments, a generalized product code scheme is provided that includes $k_0-1$ rows and containing $s_1$ parity symbols each, one row containing $s_2$ parity symbols, where $s_1 < s_2$, and the remaining $s_3$ rows containing parity such that each column corresponds to a vertical error correcting code with $s_3$ parities. The code can correct up to $s_3$ erased rows, and at the same time, it can correct one row with up to $s_2/2$ errors, and up to $s_1/2$ errors in the remaining non-erased rows.

Figure 2:
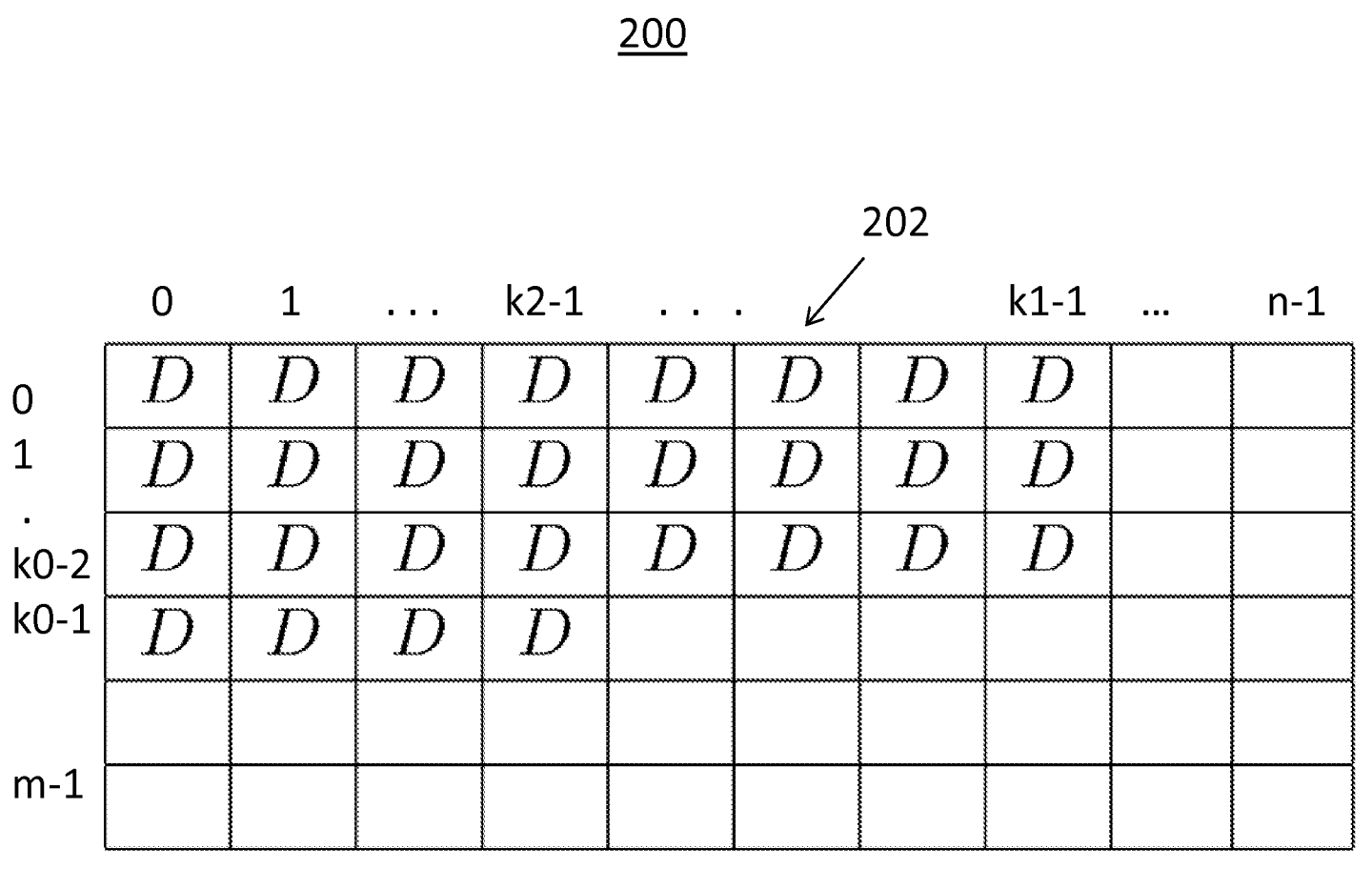
Figure 3:
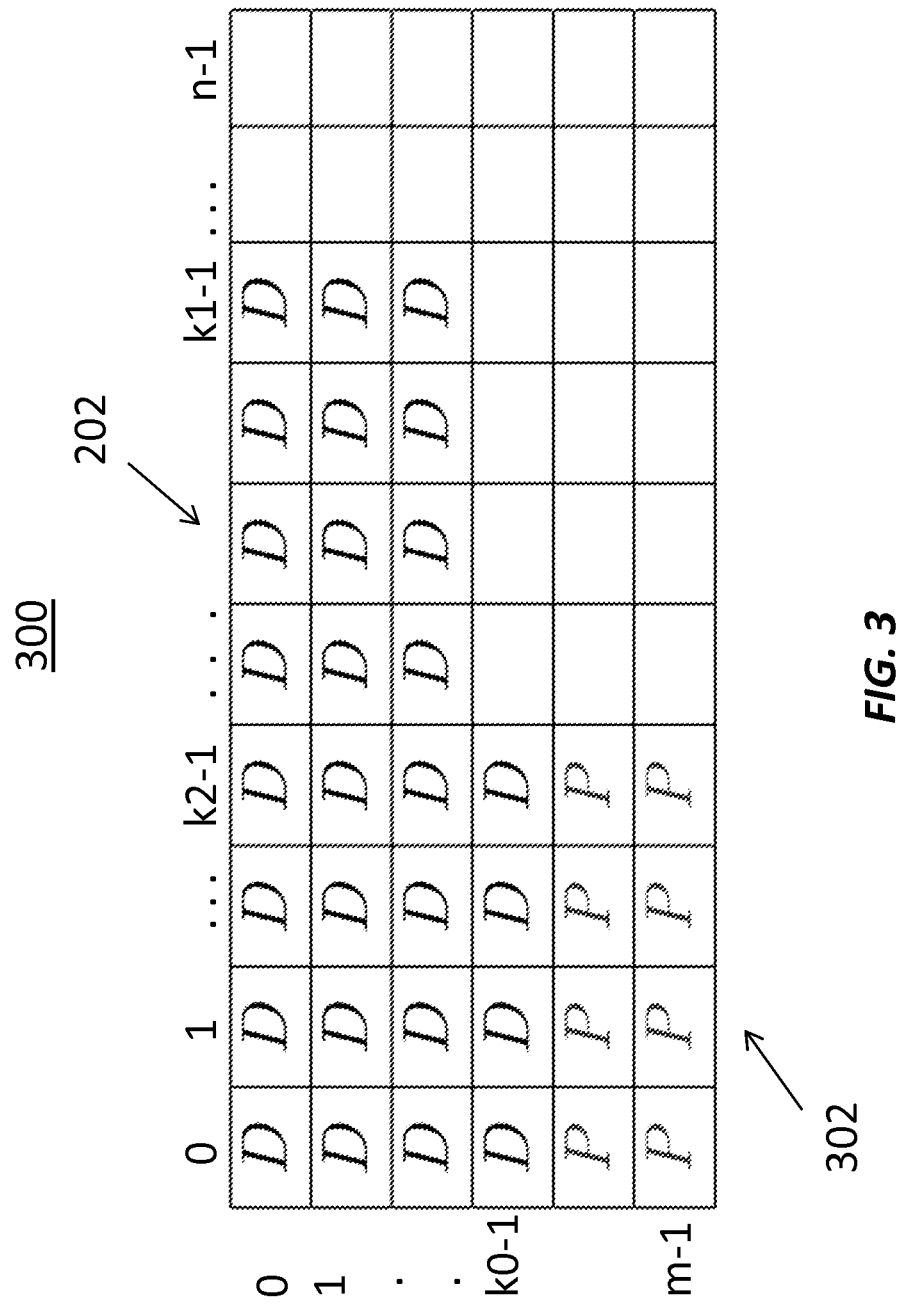
FIG. 3 depicts the array of the embodiment of FIG. 2 as a partially encoded array after a vertical parity scheme has been applied to it in accordance with an embodiment.
Figure 4:
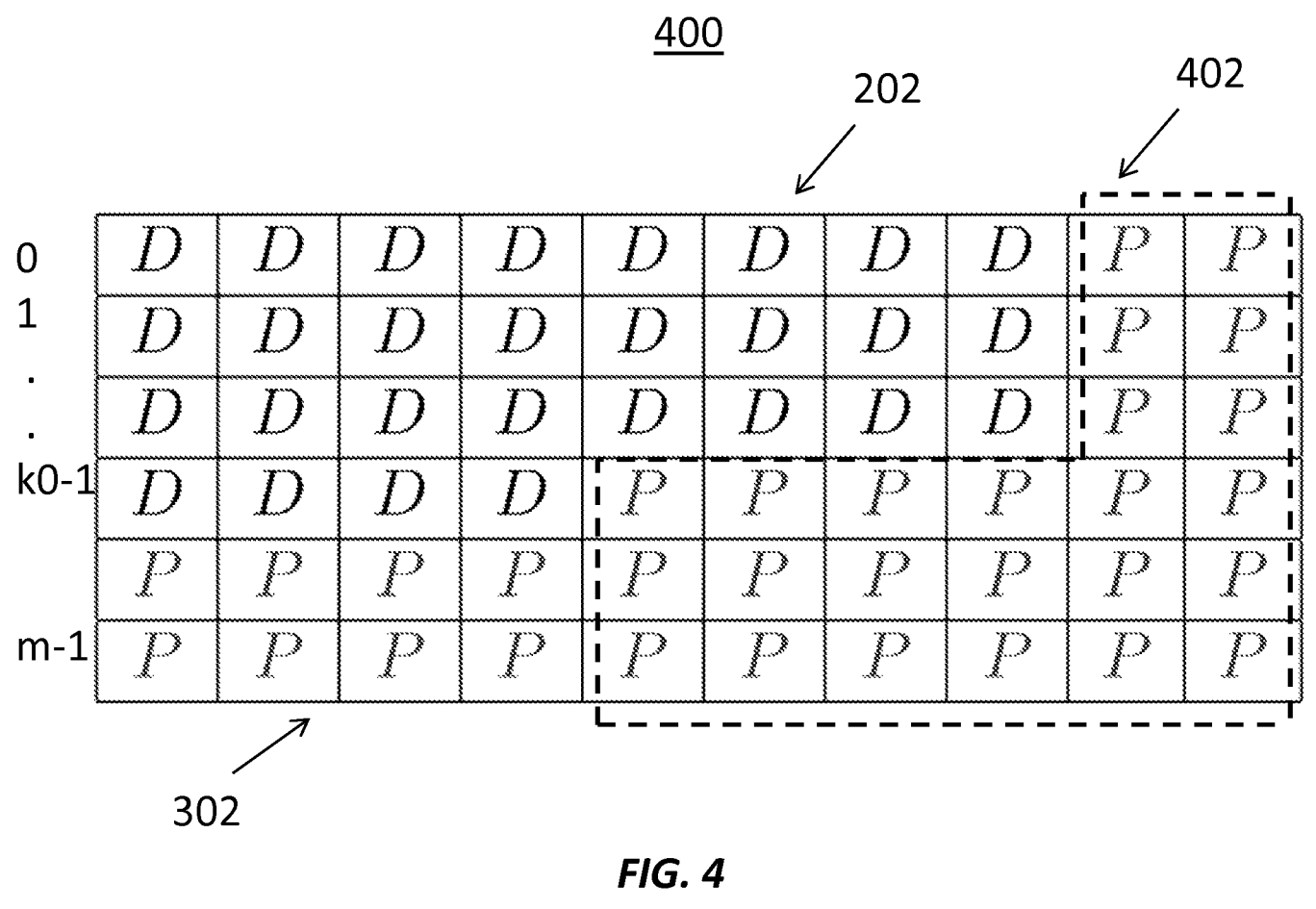

One example of a vertical error correction code used in conjunction with the discussion of FIGS. 2 through 4 is a Reed-Solomon (RS) code. RS codes are well known in the art and can be used to correct a plurality of errors and erasures. RS codes are based on symbols, with the size of the symbols depending on the application. RS codes are non-binary cyclic error correction codes and in some embodiments can be described as a systematic way of building codes that can detect and correct multiple random symbol errors. By adding t check symbols to the data, an RS code can detect any combination of up to t erased symbols (i.e., erasures), or correct up to [t/2] symbols. In addition, an RS code can also correct any combination of s errors and e erasures as long as $2s+e \le t$.

An efficient method for correction of a plurality of errors and erasures, often employing a horizontal scheme, is an Integrated Interleaved code (II) or Generalized Concatenated (GC) code. In a GC or II scheme, rows of data different redundancies are added. However, the redundancy combines the different data rows in such a way that the global data correction is enhanced with respect to a method of encoding the rows independently from each other.

In order to accurately transmit and recover an original data sequence, in an embodiment, the storage system 110 relies on a vertical data encoding code such as RS followed by a horizontal II or GC scheme employing RS codes of the same type over a same finite field. Combining a vertical code like RS with a horizontal scheme like II or GC, produces a new scheme that extends a product code (PC) scheme allowing for savings in redundancy for roughly the same error-correcting capability as the one provided by a traditional PC.

In the embodiments of FIGS. 2 through 4 as will be discussed in detail, a technique is provided for writing data that are received for encoding, that is, the operation performed by the encoder 101 in the array controller 104 of FIG. 1. FIG. 2 depicts an array 200 populated by write data symbols 202 arranged in accordance with an embodiment. FIG. 2 represents $k_0-1$ rows of write data symbols 202 each depicted as data "D", each row of length $k_1$, followed by a row of length $k_2$, where $k_2 < k_1$. For purpose of illustration, in FIG. 2 $k_0=4$, $k_1=8$ and $k_2=4$. FIG. 3 depicts a partially encoded array 300 as the array 200 of FIG. 2 after a vertical parity scheme has been applied in accordance with an embodiment. FIG. 3 represents a first step of the encoding technique in which the first $k_2$ columns of write data symbols 202 from FIG. 2 are encoded using a vertical error correcting code of length m, for example, an RS code to populate vertical parity values 302, depicted as parities "P". In this example, m=6. FIG. 4 represents the encoding of both the write data symbols 202 and the vertical parity values 302 from FIG. 3 into an Integrated Interleaved (II) or a Generalized Concatenation (GC) scheme using, for instance, RS codes of the same type as those in FIG. 3, such that $n-k_1$ parity values "P" 402 are added to the first $k_0-1$ rows and $n-k_2$ parity values "P" 402 are added to the last $n-k_0+1$ rows in FIG. 3 resulting in an encoded array 400 including at least one parity value "P" 402 in each of the m rows. In this example, n=10. The II or GC scheme provides the ability to correct up to $(n-k_2)/2$ errors in up to any $m-k_0+1$ of the rows, and up to $(n-k_1)/2$ errors in the remaining at least $k_0-1$ rows. In this example, the code depicted can correct up to three rows with up to three errors and up to one error in the remaining at least three rows.

In the embodiments of FIGS. 5 through 8 as will be discussed in detail, a technique is provided for recovering data that are received for decoding, that is, the operation performed by the decoder 103 in the array controller 104 of FIG. 1. When a copy of the encoded array 400 of FIG. 4 is read from the storage array 102 of FIG. 1 as a read array, it can include potential errors and/or erasures. Generally, a decoding process performed by the decoder 103 of FIG. 1 can include reading a copy of an encoded array including potential errors from the storage array 102 of FIG. 1 as a read array including m rows and n columns. A number e of erased rows is established, and based on determining that $e > m - k_0$, the read array may be declared uncorrectable. Each of the remaining m-e rows can be decoded for a number of at most $S_1$ errors when $e \leq m - k_0$. Any rows, where decoding is not possible, are left unchanged. Each of the n columns of the read array can be decoded using an error-erasure correcting process, where each column contains up to e erased entries. The decoding of each of the n columns of the read array using the error-erasure correcting process can correct up to s errors and e erasures, where $2s + e \leq m - k_0$. Decoding of m rows obtained using an error-correcting decoding process to correct up to $m - k_0 + 1$ rows with up to $s_2$ errors each and at least $k_0 - 1$ rows with up to $S_1$ errors each, results in a decoded array including data and parity, where $S_1 = (n - k_1)/2$, $s2 = (n - k_2)/2$. The decoding of the m rows obtained using the error-correcting decoding process may be performed using an II decoding scheme or a GC decoding scheme. The decoding of the n columns and the m rows may be based on applying RS codes over a same finite field. The data are separated from the parity in the decoded array to retrieve an estimate of written data, e.g., a reconstructed version of the array 200 of FIG. 2.

Figure 5:
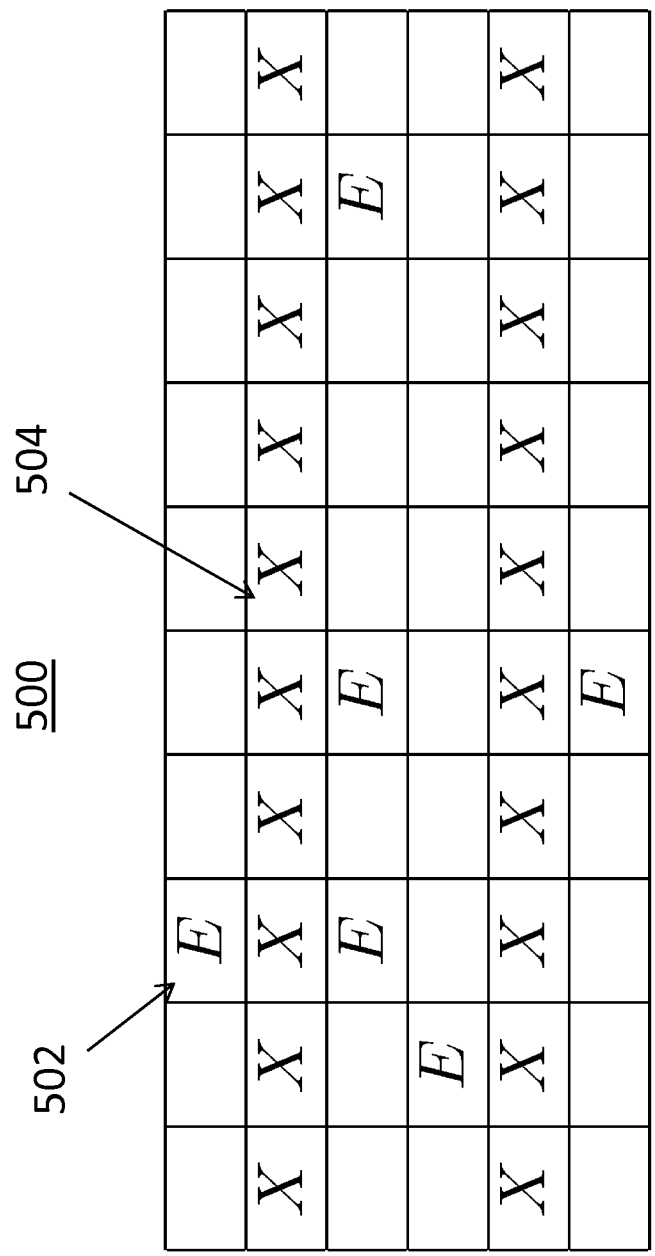
FIGS. 5 through 7 depict next stage processing steps provided in accordance to embodiments of FIGS. 2 through 4 where errors have been detected and successfully corrected.
Figure 6:
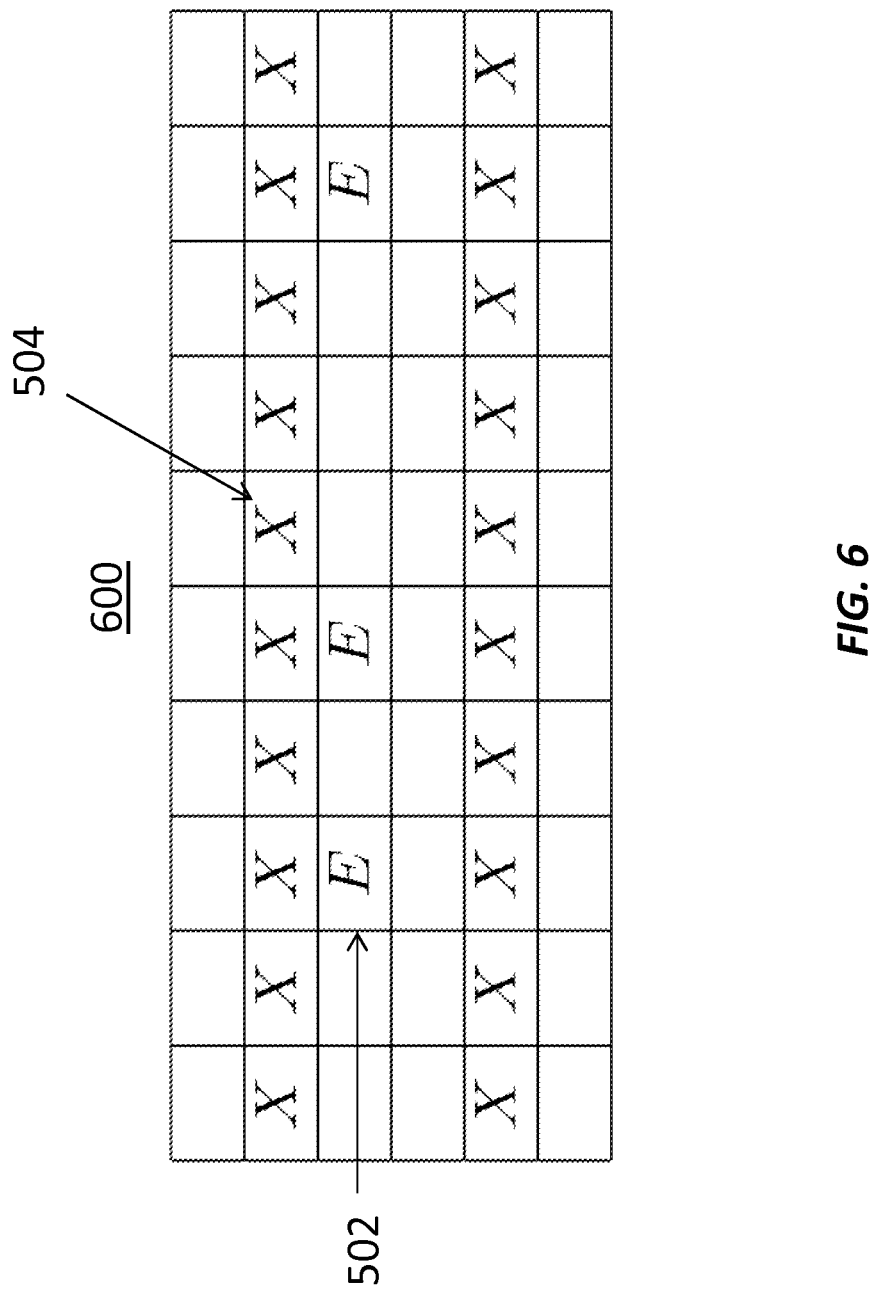

FIG. 5 provides an example of a read array 500 with m rows and n columns that has been encoded with the method described in FIGS. 2 through 4, read from the storage array 102 of FIG. 1, and that has experienced a combination of errors 502 and erasures 504. Specifically, the second and the fifth row have been erased. Erased rows correspond in tape to erased tracks on the storage devices 112 in storage array 102, and they are detected externally, for instance, if timing or a signal in a determined track is lost. Erasures 504 are denoted in the FIGS. by "X". The remaining four rows in FIG. 5 have experienced errors 502, which are denoted by "E". Specifically, the first, the fourth and the sixth rows of FIG. 5 contain exactly one error 502 each, while the third row contains three errors 502.

The first step in the decoding of the read array 500 in FIG. 5 leaves the erased rows and attempts to correct up to one error 502 in the rows with errors 502 (i.e., $(n-k_1)/2$ errors in the general case). This decoding will be successful for the first, the fourth and the sixth rows. However, the third row has three errors 502 and the decoder 103 of FIG. 1 is unable to correct it. This situation may be detected, and the row is left as it is. The result of this step is read array 600 depicted in FIG. 6.

Figure 7:
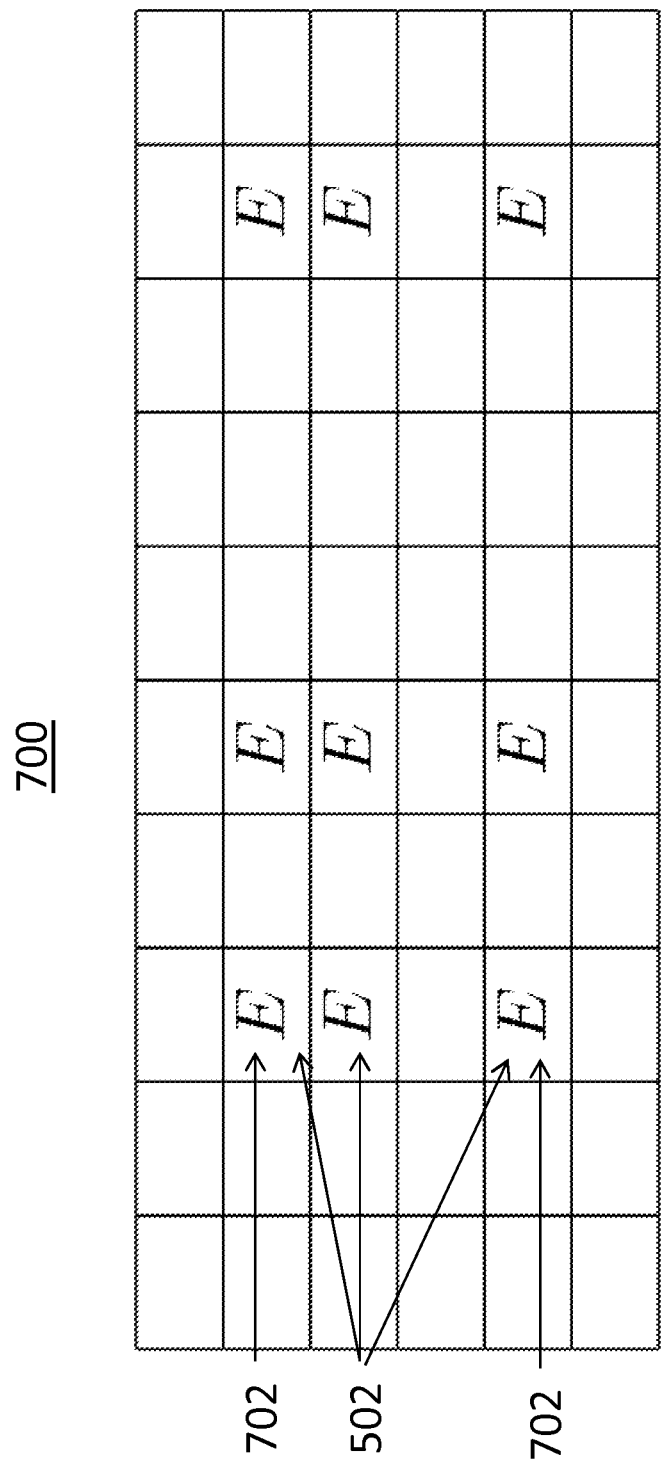

The second step in the decoding includes using a vertical code to correct two erasures 504 (in the general case, $m - k_0$ erasures 504) in each column. The result of this step will be successful most of the time, except in the third, fifth and ninth columns of FIG. 6. In those columns, since there is an error 502 in addition to the erasures 504, the decoding will add extra errors 502 in locations 702 corresponding to erasures 504 as depicted in FIG. 7. The result of this decoding is illustrated in array 700 of FIG. 7, where there are three rows with three errors 502 each (in general, $m - k_0 - 1$ rows with $(n-k_2)/2$ errors 502 each).

The final step uses the II or GC decoding techniques to correct the three rows with three errors 502 each. The result is that the errors 502 have been corrected, and the decoding has been successful. In general, the II or GC code can correct up to $m - k_0 - 1$ rows with up to $(n - k_2)/2$ errors 502 each. This completes the decoding.

Figure 8:
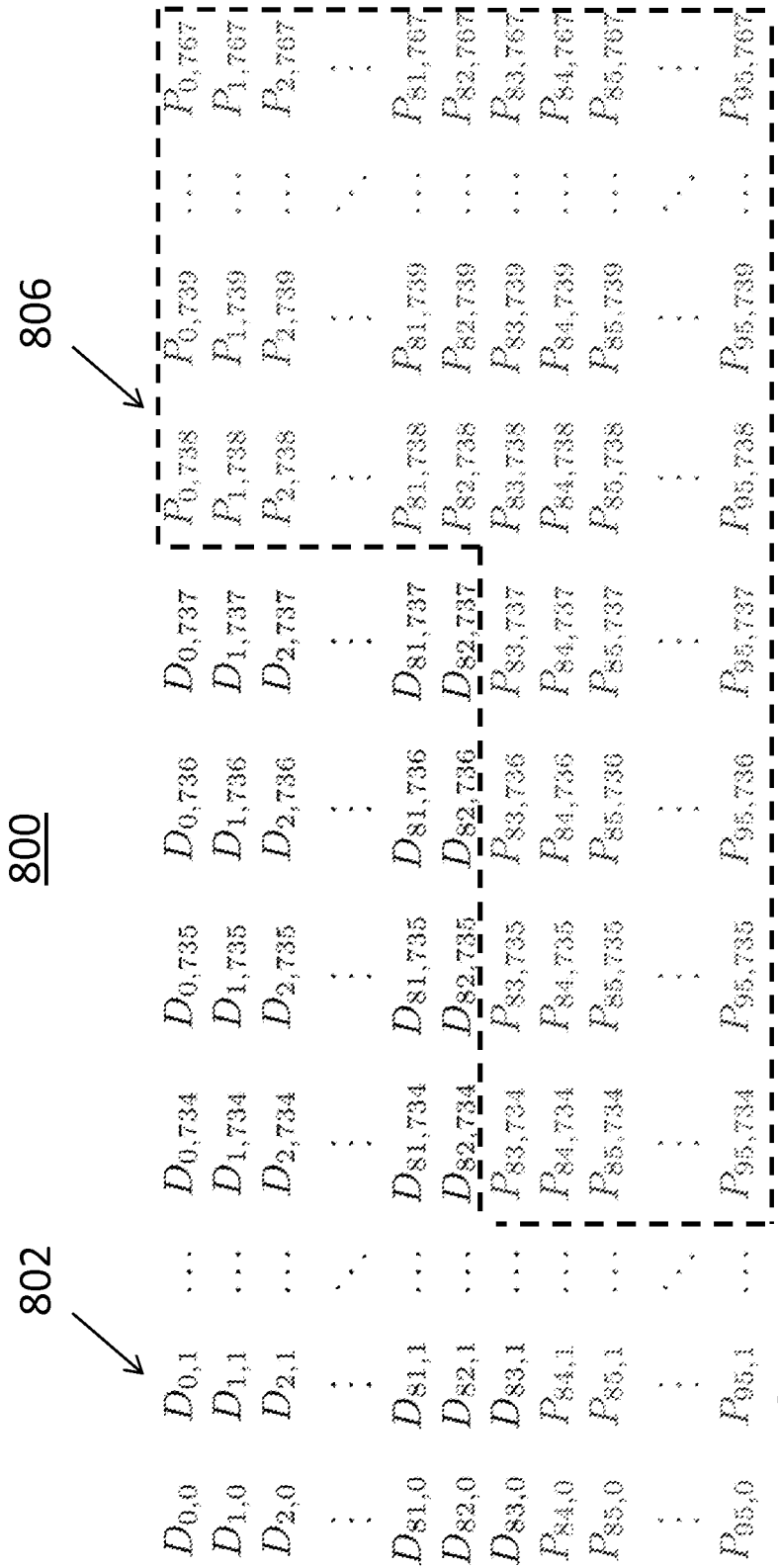
FIG. 8 depicts an exemplary array in accordance with an embodiment.

While FIGS. 2 to 7 are given for the purpose of illustration, FIG. 8 represents a more typical example as array 800. In array 800, which is more representative of an actual usage data processing circumstance, m=96 rows and n=768 columns are provided. In this example, $k_0 = 84$, $k_1 = 738$ and $k_2 = 734$. When there are 12 erased rows, up to 15 errors in any 83 of the non-erased rows and up to 17 errors in the remaining non-erased row can be corrected. The array 800 includes data symbols "D" 802, vertical parity values "P" 804 formed using a vertical code, and parity values "P" 806 which may be formed using horizontal codes. The data symbols 802 are 10-bit symbols, and RS codes are used for the horizontal and vertical codes. For example, a product code with the same number of rows and columns that can correct 17 errors per row and 6 errors per column has 61,656 10-bit data symbols. The scheme provided in FIG. 8, by comparison, can provide a similar correction capability but it increases the number of data symbols to 61,988 10-bit data symbols (i.e., an improvement of 332 data symbols over the product code). Further improvements are possible depending on the channel and the noise statistics.

Technical effects and benefits include enhanced error and erasure correction capabilities for storage arrays that include storage devices such as at least one tape. Embodiments enable a higher ratio of data symbols to check bits to be achieved as compared to typical product code correction schemes.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

Further, as will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method, comprising:
receiving $(k_0-1)k_1+k_2$ write data symbols, where $k_2<k_1$;
arranging the write data symbols in an array comprising $k_0-1$ rows of length $k_1$ followed by a row of length $k_2$;
encoding the first $k_2$ columns of the write data symbols in the array to form a partially encoded array using a vertical error correcting code of length m, $m>k_0$, resulting in $k_2$ columns of length m comprising the write data symbols from the first $k_2$ columns and vertical parity values; and
encoding the $k_0-1$ rows of the write data symbols of length $k_1$ and the $m-k_0+1$ rows of the write data symbols and the vertical parity values of length $k_2$ from the partially encoded array into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array.

2. The method of claim 1, wherein the encoding of the partially encoded array into the encoded array is performed using an Integrated Interleaved (II) scheme or a Generalized Concatenated (GC) scheme.

3. The method of claim 1, wherein the encoding of the partially encoded array and the encoded array is based on applying Reed-Solomon (RS) codes on symbols over a same finite field.

4. The method of claim 3, wherein each of the n columns corresponds to an RS code that can correct up to $(m-k_0)/2$ errors.

5. The method of claim 3, wherein each of the n columns corresponds to an RS code that can correct up to s errors together with t erasures, where $2s+t \le m-k_0$.

6. The method of claim 5, wherein each of the n columns corresponds to an RS code that can correct combinations of s errors and e erasures as long as a total error and erasure combination of $2s+e$ does not exceed $m-k_0$.

7. The method of claim 1, wherein each of the m rows in the encoded array corresponds to a track in a tape of a storage array, and the method further comprises writing the encoded array to the tape of the storage array.

8. The method of claim 7, further comprising:
reading a copy of the encoded array including potential errors from the storage array as a read array comprising m rows and n columns;
establishing a number e of erased rows, and based on determining that $e > m-k_0$, declaring that the read array is uncorrectable;
decoding each of the remaining m-e rows for a number of at most $S_1$ errors when $e \le m-k_0$;
leaving any rows, where decoding is not possible, unchanged;
decoding each of the n columns of the read array using an error-erasure correcting process, wherein each column contains up to e erased entries;
decoding the m rows obtained using an error-correcting decoding process to correct up to $m-k_0+1$ rows with up to $s_2$ errors each and at least $k_0-1$ rows with up to $S_1$ errors each, resulting in a decoded array comprising data and parity; and
separating the data from the parity in the decoded array to retrieve an estimate of written data.

9. The method of claim 8, wherein the decoding of the m rows obtained using the error-correcting decoding process is performed using an Integrated Interleaved (II) decoding scheme or a Generalized Concatenated (GC) decoding scheme.

10. The method of claim 9, wherein the decoding of the n columns and the m rows is based on applying Reed-Solomon (RS) codes over a same finite field.

11. The method of claim 8, wherein $S_1=(n-k_1)/2$, $s2=(n-k_2)/2$, and the decoding of each of the n columns of the read array using the error-erasure correcting process can correct up to s errors and e erasures, where $2s+e \le m-k_0$.

12. A system, comprising:
a storage array comprising a plurality of storage devices; and
an array controller configured to:
receive $(k_0-1)k_1+k_2$ write data symbols, where $k_2<k_1$;
arrange the write data symbols in an array comprising $k_0-1$ rows of length $k_1$ followed by a row of length $k_2$;
encode the first $k_2$ columns of write data symbols in the array to form a partially encoded array using a vertical error correcting code of length m, $m>k_0$, resulting in $k_2$ columns of length m comprising the write data symbols from the first $k_2$ columns and vertical parity values;
encode the $k_0-1$ rows of the write data symbols of length $k_1$ and the $m-k_0+1$ rows of the write data symbols and the vertical parity of length $k_2$ from the partially encoded array into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array; and
write the encoded array across the storage devices in the storage array.

13. The system of claim 12, wherein encoding of the partially encoded array into the encoded array is performed using an Integrated Interleaved (II) scheme or a Generalized Concatenated (GC) scheme.

14. The system of claim 12, wherein the encoding of the partially encoded array and the encoded array is based on applying Reed-Solomon (RS) codes on symbols over a same finite field, and each of the n columns corresponds to an RS code that can correct up to $(m-k_0)/2$ errors.

15. The system of claim 12, wherein the storage devices comprise at least one tape, and each of the m rows in the encoded array corresponds to a track in the at least one tape of the storage array.

16. The system of claim 12, wherein the array controller is further configured to:
read a copy of the encoded array including potential errors from the storage array as a read array comprising m rows and n columns;
establish a number e of erased rows, and based on determining that $e > m-k_0$, declare that the read array is uncorrectable;
decode each of the remaining m-e rows for a number of at most $S_1$ errors when $e \le m-k_0$;
leave any rows, where decoding is not possible, unchanged;
decode each of the n columns of the read array using an error-erasure correcting process, wherein each column contains up to e erased entries;
decode the m rows obtained using an error-correcting decoding process to correct up to $m-k_0+1$ rows with up to $s_2$ errors each and at least $k_0-1$ rows with up to $S_1$ errors each, resulting in a decoded array comprising data and parity; and
separate the data from the parity in the decoded array to retrieve an estimate of written data.

17. A computer program product, comprising: a non-transitory computer readable storage medium having computer readable program code embodied therewith, the computer readable program code executable by an array controller to:
receive $(k_0-1)k_1+k_2$ write data symbols, where $k_2<k_1$;
arrange the write data symbols in an array comprising $k_0-1$ rows of length $k_1$ followed by a row of length $k_2$;
encode the first $k_2$ columns of write data symbols in the array to form a partially encoded array using a vertical error correcting code of length m, $m>k_0$, resulting in $k_2$ columns of length m comprising the write data symbols from the first $k_2$ columns and vertical parity values; and
encode the $k_0-1$ rows of the write data symbols of length $k_1$ and the $m-k_0+1$ rows of the write data symbols and the vertical parity of length $k_2$ from the partially encoded array into an encoded array of m rows of length n columns, $n>k_1$ including at least one parity value in each of the m rows, thereby enabling correction of up to $(n-k_1)/2$ errors in any row and up to $(n-k_2)/2$ errors in up to $m-k_0+1$ rows of the encoded array.

18. The computer program product of claim 17, wherein encoding of the partially encoded array into the encoded array is performed using an Integrated Interleaved (II) scheme or a Generalized Concatenated (GC) scheme.

19. The computer program product of claim 17, wherein the encoding of the partially encoded array and the encoded array is based on applying Reed-Solomon (RS) codes on symbols over a same finite field, and each of the n columns corresponds to an RS code that can correct up to $(m-k_0)/2$ errors.

20. The computer program product of claim 17, wherein each of the m rows in the encoded array corresponds to a track in a tape of a storage array, and the computer readable program code is further executable by the array controller to write the encoded array to the tape of the storage array.

* * * * *